United States Patent [19]
Jayaraman

[11] Patent Number: 5,985,686
[45] Date of Patent: Nov. 16, 1999

[54] PROCESS FOR MANUFACTURING VERTICAL CAVITY SURFACE EMITTING LASERS USING PATTERNED WAFER FUSION AND THE DEVICE MANUFACTURED BY THE PROCESS

[75] Inventor: Vijaysekhar Jayaraman, Goleta, Calif.

[73] Assignee: W. L. Gore & Associates, Inc., Newark, Del.

[21] Appl. No.: 09/014,778

[22] Filed: Jan. 28, 1998

Related U.S. Application Data

[62] Division of application No. 08/701,110, Aug. 21, 1996, abandoned.

[51] Int. Cl.$^6$ .............................. H01L 33/00; H01S 3/08; H01S 3/19
[52] U.S. Cl. ................................ 438/32; 438/39; 372/45; 372/96; 257/98
[58] Field of Search .......................... 438/32, 39; 257/98; 372/45, 96

[56] References Cited

U.S. PATENT DOCUMENTS

| | | | |
|---|---|---|---|
| 5,245,622 | 9/1993 | Jewell et al. | 372/45 |
| 5,258,316 | 11/1993 | Ackley et al. | 437/24 |
| 5,293,392 | 3/1994 | Shieh et al. | 372/96 |
| 5,343,487 | 8/1994 | Scott et al. | 372/45 |
| 5,493,577 | 2/1996 | Choquette et al. | 372/46 |
| 5,513,204 | 4/1996 | Jayaraman | 372/96 |
| 5,594,751 | 1/1997 | Scott | 372/45 |
| 5,661,075 | 8/1997 | Grodzinski et al. | |
| 5,812,571 | 9/1998 | Peters . | |

OTHER PUBLICATIONS

Chua et al., "Low–Threshold 1.57 Micron VC–SEL's Using Strain–Compensated Quantum Wells and Oxide/Metal Backmirror," IEEE Photonics Technology Letters, vol. 7, No. 5, May 1, 1995, pp. 444–446.

Piprek et al., "Numerical Analysis of 1.54 Micron Double–Fused Vertical–Cavity Laser Operating Continuous–Wave Up to 33°C," Appl. Phys. Lett., vol. 68, No. 19, May 6, 1996, pp. 2620–2632.

Deng et al., "Oxide–Confined Vertical–Cavity Laser with Additional Etched Void Confinement," Electronic Electronic Letters, vol. 32, No. 10, May 9, 1996, pp. 900–901.

Dudley et al. "Wafer Fused Long Wavelength Vertical Cavity Lasers," IEEE, Nov. 15, 1993, pp. 560–561.

Lear et al. "High–Frequency Modulation of Oxide–Confined Vertical Cavity Surface Emitting Lasers" IEE, Dec. 21, 1995, Electronic Letters Online No: 19960334.

Choquette et al. "Fabrication and Performance of Selectively Oxidized Vertical–Cavity Lasers" IEEE, vol. 7, No. 11, Nov. 1995, pp. 1237–1239.

Dudley et al., "Low Threshold Wafer Fused Long Wavelength Vertical Cavity Laser", Appl. Phys. Lett 64 (12), pp. 1463–1465 (Date Not Available).

(List continued on next page.)

*Primary Examiner*—David E. Graybill
*Attorney, Agent, or Firm*—Victor M. Genco, Jr.

[57] ABSTRACT

In the fabrication of vertical cavity surface emitting lasers, patterned wafer fusion promotes low-loss refractive index guiding combined with a mechanically robust and reproducibly fabricatable structure. A fabricated laterally refractive index guided VCSEL includes a plurality of layers of semiconductor, including a bottom mirror stack disposed above a semiconductor substrate, an active region having upper and lower claddings sandwiching a layer of quantum wells disposed above the bottom mirror stack, and a top mirror stack disposed above the active region. A recessed pattern is etched in one of the plurality of layers to create a mode confining layer, prior to wafer fusion, which forms a buried air gap subsequent to wafer fusion. The buried air gap provides a lateral refractive index profile, which functions as a low-loss means for index guiding the VCSEL optical energy to the single fundamental transverse mode.

7 Claims, 4 Drawing Sheets

OTHER PUBLICATIONS

Chua et al "Long Wavelength VCSELs using Wafer–Fused GaAs/AlAs Bragg Mirror and Strain–Compensated Quantum Wells" Conference Proceedings—IEEE, pp. 420–421 (Date Not Available).

Murtaza et al. "High Finesse Resonant–Cavity Photodetectors with an Adjustable Resonance Frequency" J. of Light wave Technology, 14(6), pp. 1081–1089 (Date Not Available).

Ohiso et al. "1.55 µm Vertical Cavity Surface Emitting Lasers with Wafer–Fused InGaAsP/InP–GaAs/AlAs DBRs", Electronic Letters 32(16) pp. 1483–1484 (Date Not Available).

5,985,686

PROCESS FOR MANUFACTURING VERTICAL CAVITY SURFACE EMITTING LASERS USING PATTERNED WAFER FUSION AND THE DEVICE MANUFACTURED BY THE PROCESS

CROSS-REFERENCE TO RELATED APPLICATION

This application is a divisional of application Ser. No. 08/701,110, filed Aug. 21, 1996, abandoned.

FIELD OF THE INVENTION

This invention relates to vertical cavity surface emitting lasers, and more particularly to patterned wafer fusion in the fabrication of vertical cavity surface emitting lasers.

BACKGROUND OF THE INVENTION

A vertical cavity surface emitting laser (VCSEL) is a semiconductor laser including a semiconductor layer of optically active material, such as gallium arsenide or indium phosphide. The optically active material is sandwiched between mirror stacks formed of highly-reflective layers of metallic material, dielectric material, or epitaxially-grown semiconductor material. Conventionally, one of the mirror stacks is partially reflective so as to pass a portion of the coherent light which builds up in a resonating cavity formed by the mirror stacks sandwiching the active layer. At least one of the mirror stacks has a reflectivity greater than approximately 99.5%

Lasing structures require optical confinement in the resonating cavity and carrier confinement in the active region to achieve efficient conversion of pumping electrons into stimulated photons through population inversion. The standing wave of reflected optical energy in the resonating cavity has a characteristic cross-section giving rise to an optical mode. A desirable optical mode is the single fundamental transverse mode, for example, the $HE_{11}$ mode of a cylindrical waveguide. A single mode signal from a VCSEL is easily coupled into an optical fiber, has low divergence, and is inherently single frequency in operation.

In order to reach the threshold for lasing, the total gain of a VCSEL must equal the total loss of the VCSEL. Unfortunately, due to the compact nature of VCSELs, the amount of gain media is limited. Because epitaxially-grown mirror stacks often do not enable sufficiently high reflectivity, some vertical cavity surface emitting lasers are formed by wafer fusing the top and bottom mirror stacks to the active region. Wafer fusion is a process by which materials of different lattice constant are atomically joined by applying pressure and heat to create a real physical bond. Thus, wafer fusion of one or both of the mirror stacks to the active region is used to increase the reflectivity provided by either or both of the mirrors to compensate for the small amount of gain media so that the lasing threshold can be reached and maintained.

An important requirement for low-threshold, high- efficiency VCSEL operation is a lateral refractive index variation or index guiding mechanism which introduces low optical loss for the VCSEL. Lateral oxidation of AlGaAs has been used for refractive index guiding to make high-efficiency VCSELs. In such a lateral oxidation technique, a mesa is etched into the top surface of the VCSEL wafer, and the exposed sidewalls of an AlGaAs layer are exposed to water vapor. Water vapor exposure causes conversion of the AlGaAs to $AlGaO_x$, some distance in from the sidewall toward the central vertical axis, depending on the duration of oxidation. This introduces a lateral refractive index variation, creating a low-loss optical waveguide if the $AlGaO_x$ layer is sufficiently thin. Shortcomings of this approach are that it leads to a non-planar structure, since mesa etches are required, and the oxidized AlGaAs expands, producing a fragile mesa. The reliability of VCSELs using this technique is unknown.

SUMMARY OF THE INVENTION

In VCSELs where wafer fusion is employed, it is possible to create performance comparable to a laterally-oxidized device using patterned wafer fusion instead of lateral oxidization. Patterned wafer fusion according to the invention creates thin recessed patterns by etching, and buried air gaps (or buried low refractive index material with an optional deposition step) by subsequently wafer fusing, one or more interfacing layers of the VCSEL. The buried air gaps perform refractive index guiding of the optical mode of the VCSEL in place of buried oxide layers produced by the previously described lateral oxidization technique.

The invention provides a method of patterned wafer fusion for use in wafer-scale VCSEL fabrication, useful for low-loss, mechanically robust refractive index guiding. A recessed pattern is etched in one of a plurality of semiconductor layers of a wafer to create a mode confining layer. The pattern creates islands of unetched semiconductor in the mode confining layer in which optical energy is confined. The mode confining layer is wafer fused to an adjacent layer to create buried air gaps (or buried low refractive index material if an optional deposition step is performed prior to wafer fusion) circumscribing the islands providing lateral refractive index guiding at the wafer fused interface between the mode confining layer and the adjacent layer in the fabricated VCSEL.

In an illustrative embodiment, a laterally refractive index guided wafer-fused composite-layer VCSEL fabricated according to the invention includes a plurality of layers of semiconductor, including a bottom distributed Bragg reflector (DBR) mirror stack disposed above a semiconductor substrate, an active region having upper and lower claddings sandwiching a layer of quantum wells and being disposed above the bottom DBR mirror stack, and a top DBR mirror stack disposed above the active region. The mirror stacks are wafer fused to the active region.

A recessed pattern is etched in one of the plurality of layers to create a mode confining layer. The recessed pattern creates an island of unetched semiconductor in the mode confining layer in which optical energy is confined. The mode confining layer is wafer fused to an adjacent layer of the composite-layer VCSEL to create a buried air gap circumscribing the unetched island. The buried air gap creates a lateral refractive index guide at the wafer fused interface between the mode confining layer and the adjacent layer in the VCSEL.

In a specific embodiment, the pattern in the mode confining layer is a recessed annular notch. The recessed annular notch is etched in a cladding surface of the active region or in a layer of one mirror stack to be wafer fused to the active region, prior to wafer fusion. The island of unetched semiconductor within the annular notch defines the index-guided VCSEL location in the wafer. The optical mode of the operating VCSEL is confined to the island within the annular notch. The recessed annular notch funnels current flow through the island into the active region. High-order optical modes radially outward from the island are inhibited.

In a specific embodiment, the notch presents a staircase configuration having a shallow inner level at a preselected first etch depth and a deeper outer level at a preselected second etch depth. The deeper outer level defines the island in which the optical mode is confined. The shallow inner level, radially inward from the deeper outer level, functions as a current aperture to confine current to the portion of the active region that corresponds to the single fundamental optical mode. The staircase combination of the shallow inner level and the deeper outer level cooperate to accentuate the fundamental optical mode while inhibiting higher-order optical modes.

When the wafer-fused fabricated VCSEL is completed, such recessed annular notch creates a buried air gap in the fabricated composite-layer VCSEL. Such buried air gap provides index-guided operation with low optical loss, an escape route for trapped gas or liquid, and a mechanically robust fused structure.

Advantages of patterned fusion according to the invention include that the resulting VCSEL structure is planar, mechanically robust, and potentially more reliable than fabrication involving lateral oxidation. Patterned fusion also allows the size of the VCSEL to be determined by photolithography rather than oxidation time, which leads to more reproducible and predictable fabrication.

Other features and advantages of the invention will become apparent from the following detailed description, taken in conjunction with the accompanying drawing, which illustrate, by way of example, the features of the invention.

DETAILED DESCRIPTION OF THE PREFERRED EMBODIMENT

In this description, "top" or "upper" are relative terms referring to regions of the VCSEL away from the substrate, and "bottom" and "lower" mean toward the substrate.

Patterned wafer fusion used in the fabrication of a vertical cavity surface emitting laser ("VCSEL") according to the principles of the invention promotes low-loss refractive index-guiding, combined with a mechanically robust and reproducibly fabricatable structure. A laterally refractive index guided composite-layer VCSEL fabricated according to the invention includes a plurality of semiconductor layers, including a bottom distributed Bragg reflector (DBR) mirror stack disposed above a semiconductor substrate, an active region having upper and lower claddings sandwiching a layer of quantum wells disposed above the bottom DBR mirror stack, and a top DBR mirror stack disposed above the active region. The mirror stacks each present a system of alternating layers of GaAs and AlGaAs forming the respective mirror stack. The quantum well layer includes InGaAsP, AllnGaAs, or combinations thereof, and the claddings include InP. The bottom mirror stack, the active region, and the top mirror stack together define an optical cavity having a central vertical axis. A preselected pattern etched in either or both of a GaAs layer in the top or bottom mirror stacks, or in an InP cladding in the active region, prior to wafer fusion, creates buried air gaps after wafer fusion (or buried low refractive index material as a result of an optional deposition step intermediate the etching step(s) and the wafer fusing step(s)) in one or more interfacing layers of the bottom mirror stack, the active region, or the top mirror stack. The buried air gap provides a lateral refractive index profile, which varies from the central vertical axis radially outward. The lateral refractive index profile functions as a low-loss means for index guiding the VCSEL optical energy to the single fundamental transverse mode.

Figure 1:
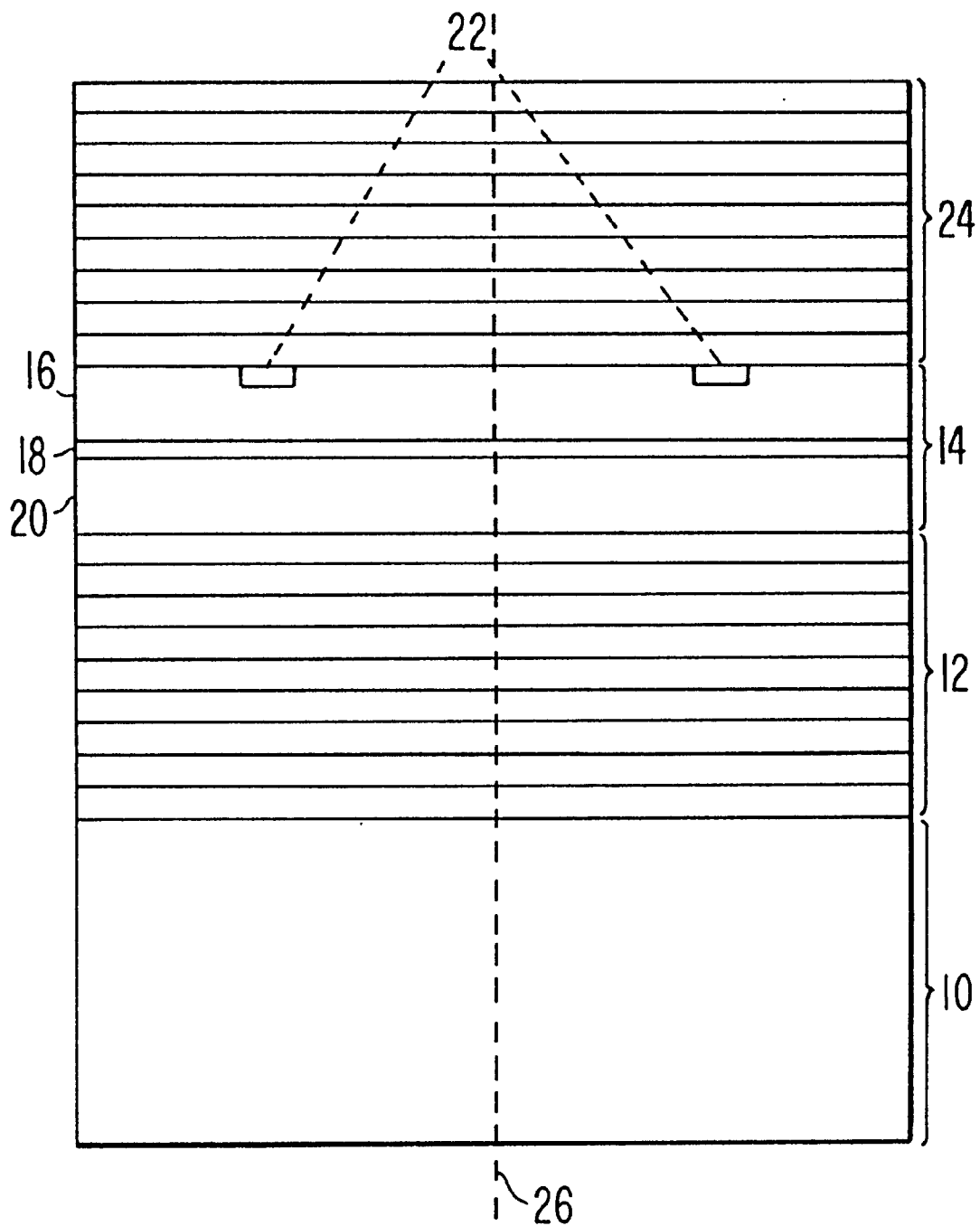
FIG. 1 is an elevational sectional view of a vertical cavity surface emitting laser ("VCSEL") according to the principles of the invention.

Referring to FIG. 1, a laterally refractive-index guided composite-layer wafer-fused VCSEL is constructed on a GaAs semiconductor substrate 10. A bottom mirror stack 12 is disposed above the substrate. The bottom mirror stack is organized as a system of alternating layers of GaAs and AlGaAs forming a distributed Bragg reflector (DBR) designed for a wavelength in a range from 1250 nm to 1650 nm. An active region 14 includes an upper InP cladding 16, a quantum wells layer 18 which can include InGaAsP, AllnGaAs, or combinations thereof, and a lower InP cladding 20. The active region is wafer fused above the bottom mirror stack. An annular recessed notch 22 for refractive-index guiding, and connecting channels for air and fluid escape, are etched in upper cladding 16 of active region 14. A top mirror stack 24 is wafer fused above active region 14 so that annular notch 22 becomes a buried air gap. The top mirror stack is organized as a system of alternating layers of GaAs and AlGaAs forming a DBR. Top mirror stack 24 is designed for a wavelength in a range from 1250 nm to 1650 nm.

If the VCSEL shown in FIG. 1 is optically pumped, it requires no further processing. The buried air gap provides low-loss index guiding to determine the optical mode of the operating VCSEL, and the limited lateral extent of the pump beam (radially with respect to the central vertical axis 26) provides current confinement.

If the VCSEL shown in FIG. 1 is electrically pumped, a pair of electrical contacts can be applied above and below the top mirror stack and the substrate to couple electrical energy to the VCSEL. The optical mode of the operating VCSEL is confined to the island of unetched material radially inward of the annular notch forming the buried air gap. The buried air gap funnels electrical current flow into the portion of the active region 14 beneath the island.

Figure 2:
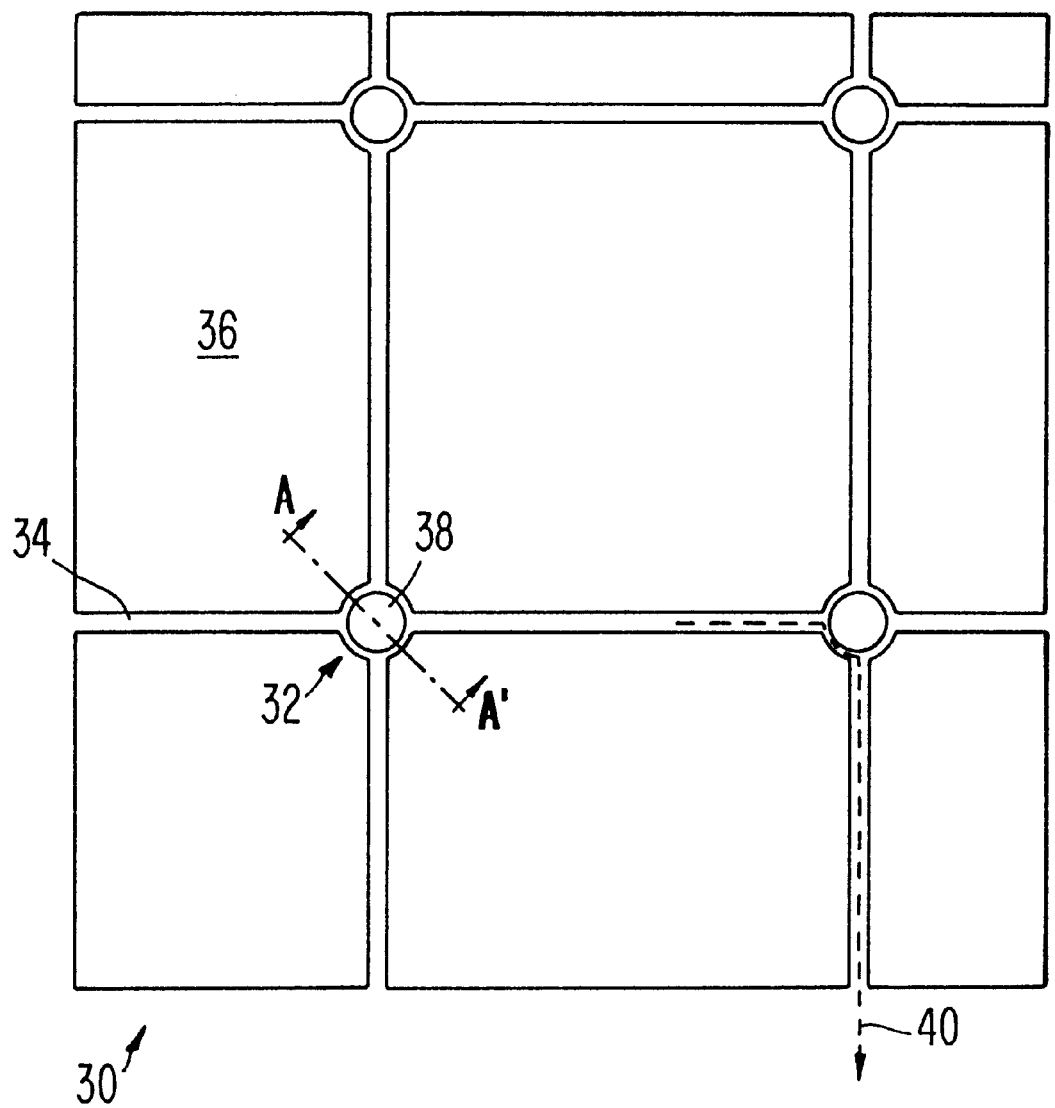
FIG. 2 is a plan view of a mode confining layer in a wafer supporting the fabrication of a two-dimensional array of four VCSELs according to the principles of the invention.

FIG. 2 is a schematic plan view of a wafer supporting the fabrication of a two-dimensional array of four VCSELs. The plan view depicts the wafer-scale nature of the fabrication technology, which can be used to make single VCSELs, and can also be used to make large one and two-dimensional arrays of VCSELs.

A recessed pattern is etched in the wafer during wafer-scale fabrication, prior to wafer fusion, to create a mode confining layer 30 for index guiding the optical modes of the VCSELs into the single fundamental mode. The pattern shown is a grid of annular notches 32 connected by channels 34. Unetched fused areas are adjacent the etched annular notches and channels, throughout the mode confining layer 30. The unetched outer areas (e.g., area 36), which will subsequently be fused, provide mechanical support for the final fused structure; and the unetched islands (e.g., island 38), which will subsequently be fused, determine the index-guided device locations. That is, the central vertical axis of the optical cavity of a VCSEL made from the wafer is within an unetched island circumscribed by an annular notch. Each annular notch in the connected grid can have a specific shape in a plan view of mode confining layer 30. The shape shown is circular, but could be rectangular, square, elliptic, oval, polygonal, or any other equivalent two-dimensional shape for creating the island of unetched semiconductor material.

The grid of annular notches connected by channels in mode confining layer 30 provides a path 40 from any etched portion of the mode confining layer to an edge of the mode confining layer through etched channels (e.g., channel 34). The channels allow trapped air or liquid to escape during wafer fusion.

The mode confining layer in an epitaxially-grown active region or mirror stack will be wafer fused to an adjacent layer to create a wafer-fused interface in a completed VCSEL. The majority of the surface area of the mode confining layer at the wafer fused interface is not etched. This ensures a strong, reliable wafer-fused bond (e.g., between the upper cladding and the top mirror stack as shown in FIG. 1, or between layers of a mirror stack). The grid of channels interconnecting the etched annular notches also provides strain relief to accommodate the different thermal expansions of the materials being fused, during wafer-scale processing. The etched pattern in the mode confining layer of the fabricated composite-layer VCSEL combines low-loss refractive index guiding with mechanically robust wafer fusion. The optical mode of the completed VCSEL is confined to the unetched island.

FIGS. 3, 4, 5(a) and 5(b) are elevational sectional views taken along line A–A' in FIG. 2 showing three exemplary configurations of the etched annulus in the mode confining layer prior to wafer fusion. The etching step(s) which create the mode confining layer can be performed in any of the plurality of layers of the composite-layer structure. In the illustrative embodiment, pattern etching is conducted on the upper cladding surface of the active region prior to wafer fusing the upper cladding and the top mirror stack to create the buried air gap, which determines the optical mode of the VCSEL.

Figure 3:
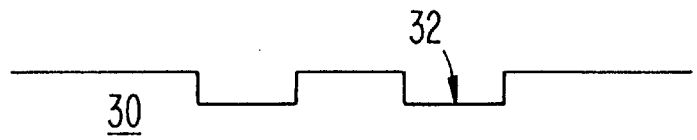
FIG. 3 is an elevational sectional view taken along the line A–A' in FIG. 2 of a recessed pattern formed in the mode confining layer according to a first embodiment of the invention.

Referring to FIG. 3, the etch depth of the annular notch 32 in the mode confining layer 30 is sufficiently shallow to create a single fundamental transverse mode device. This depth is less than one-quarter of the emission wavelength in the semiconductor material being etched, and its exact value for single-mode lasing operation is a function of the shape and transverse (i.e., radial, with respect to the central vertical axis) dimension of the device. The precise etch depth required can be calculated theoretically with published analytical techniques, or determined experimentally. The notch is preferably placed (along the central vertical axis) at a minimum of the standing wave optical field in the optical cavity.

Optionally, a deposition step (or steps) can be performed on the mode confining layer after etching and prior to wafer fusion. The goal of the deposition step is to deposit a material having a low refractive index into the annular notch so that a buried low refractive index material region results from wafer fusion. The material deposited has a lower refractive index than the semiconductor layer being etched. The semiconductor layer being etched typically has a refractive index of about 3.4. The material deposited to fill the etched annular notch can be silicon dioxide ($SiO_2$), silicon nitride ($Si_3N_4$), or equivalent. Silicon dioxide has a refractive index of about 1.5, and silicon nitride has a refractive index of about 2.0.

Preferably, however, this deposition step is omitted and the etched notch remains unfilled so that a buried air gap results from wafer fusion. Air has a refractive index of about 1.0.

Figure 4:
FIG. 4 is an elevational sectional view taken along the line A–A' in FIG. 2 of a recessed pattern formed in the mode confining layer according to a second embodiment of the invention.

In an alternative design process illustrated in FIG. 4, the contour of the etch into the mode confining layer 30 can be tapered along line A–A' (FIG. 2) to enhance single-mode lasing operation and reduce optical loss by inhibiting lasing modes other than the fundamental transverse mode. Multiple etch steps can be used to produce such tapered etch depth and sloped contour of the annular notch 44 of each VCSEL in the array of VCSELs to reduce optical loss.

Figure 5A:
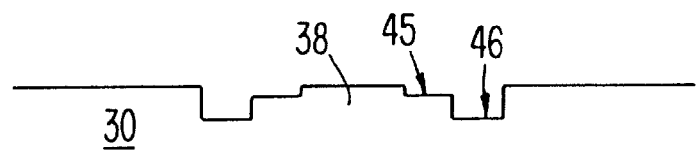
FIGS. 5(a) and (b) are elevational sectional views taken along the line A–A' in FIG. 2 of a recessed pattern formed in the mode confining layer according to a third embodiment of the invention for describing the optical field intensity of the fundamental optical mode and higher-order optical modes.

The smoothly tapered etch can be approximated by two or more etch steps to create a unitary staircase configuration which serves the same function as the tapered etch. FIG. 5(a) shows a two-step approximation of a tapered etch taken along the line A–A' in FIG. 2. The inner shallow etch level 45 confines current, but not the optical energy, and the deeper etch level 46 confines the optical energy. The net result is that the fundamental transverse optical mode is pumped more efficiently than the higher-order optical modes. Deeper etch level 46 defines the island 38 in which the optical lasing mode is confined. Inner shallow etch level 45, which is radially inward from deeper etch level 46, creates a current aperture to confine current flow to the portion of the active region beneath the island, which corresponds to the fundamental optical mode. This allows the center of the optical field to be preferentially pumped, enhancing fundamental-mode operation and inhibiting higher-order modes.

Figure 5B:
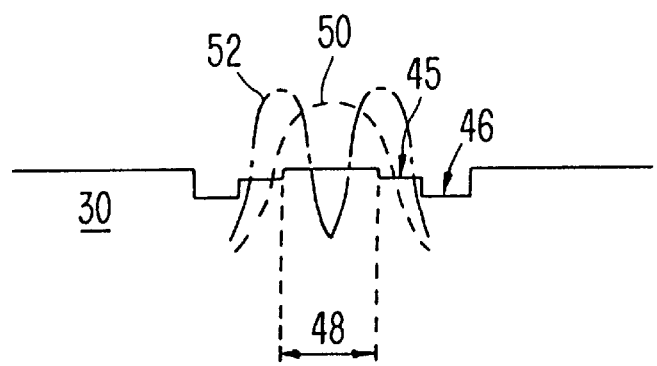

Referring to FIG. 5(b), efficient pumping of modes occurs when the region of current injection 48 overlaps well with the region where optical field intensity is high. For the fundamental mode, the optical field intensity 50 is peaked in the center of the island 38, so constricting the current to this central region 48 using shallow etch level 45, as shown in FIG. 5(b), results in efficient pumping thereof. The optical field intensity 52 of higher-order transverse modes is peaked at the edges of island 38, so injecting current in the center of the island results in inefficient pumping of such higher-order modes. Thus, the fundamental mode will be pumped more efficiently, and single-mode lasing operation is obtained.

Figure 6:
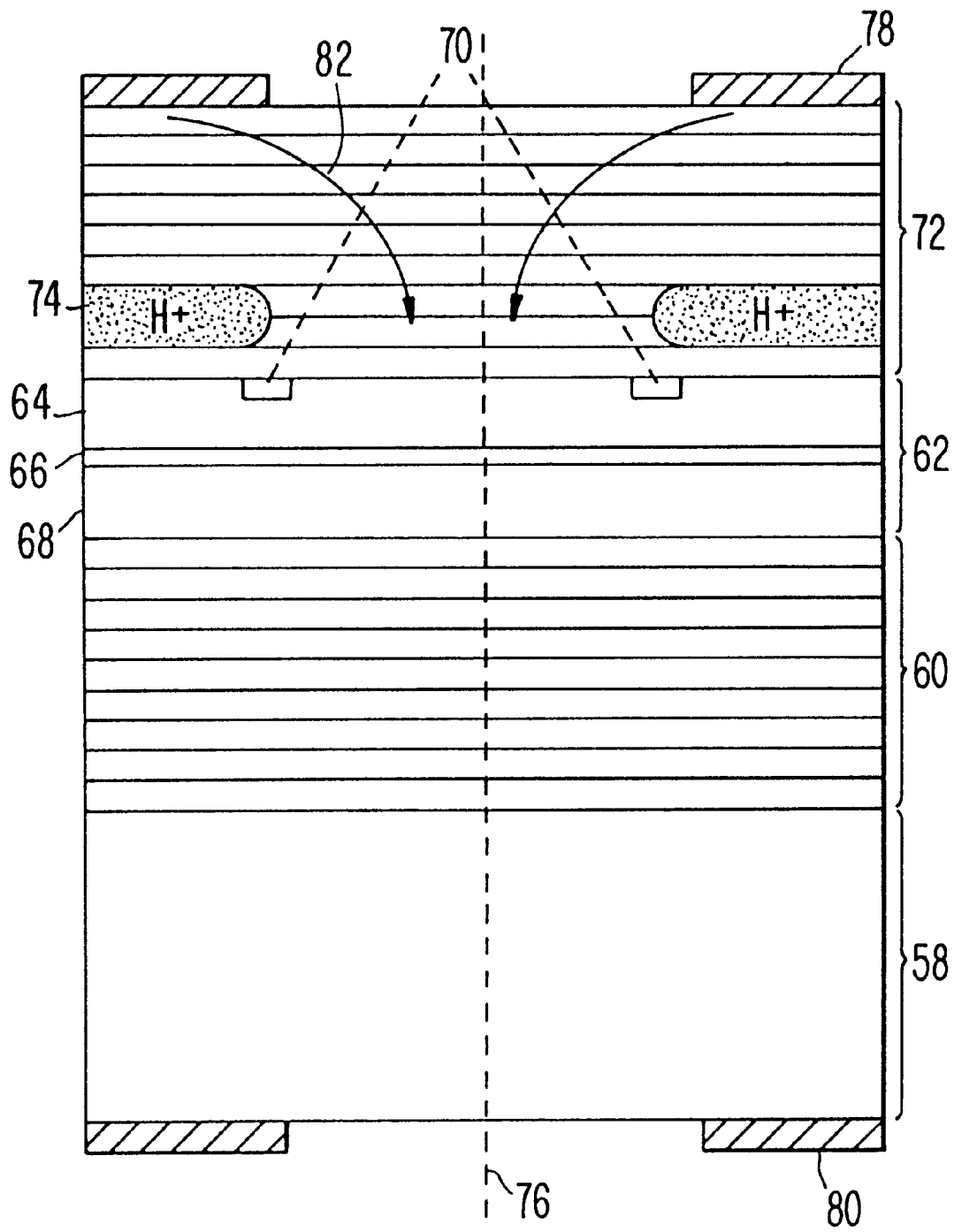
FIG. 6 is an elevational sectional view of a VCSEL according to the principles of the invention.

Referring to FIG. 6, an electrically pumped laterally refractive index guided wafer-fused VCSEL is fabricated on a GaAs semiconductor substrate 58 for emission at a wavelength in a range from 1250 nm to 1650 nm. Ion implantation is utilized to create an aperture for carrier confinement. A recessed pattern for index-guided mode confinement is etched in the upper cladding of its active region, and the patterned cladding is then wafer-fused to the top mirror stack to create the buried air gap which confines the optical mode of the VCSEL to the single fundamental transverse mode. An n-type bottom mirror stack 60 having 99.98% reflectivity is formed above the GaAs substrate. The bottom mirror stack consists of a system of alternating layers of GaAs and AlGaAs forming a distributed Bragg reflector (DBR) designed for a wavelength in a range from 1250 nm to 1650 nm. An active region 62 is disposed by wafer fusion above the bottom DBR mirror stack. The active region includes an upper InP cladding 64, a layer of quantum wells 66 consisting of material selected from the group consisting of InGaAsP, AlInGaAs, or combinations thereof, and a lower InP cladding 68. The etched recessed pattern is an annular notch 70 and one or more connecting channels in upper cladding 64 which create, as a result of wafer fusion, a buried air gap for index guiding the VCSEL into single fundamental mode operation. A p-type top mirror stack 72 is wafer fused above upper cladding 64. Top mirror stack 72 consists of a system of alternating layers of GaAs and AlGaAs forming a DBR designed for a wavelength in a range from 1250 nm to 1650 nm.

Protons are implanted in top mirror stack 72 in an ion implantation step. This creates an annular current confining region 74 located in a bottom planar portion of the top mirror stack and centered about central vertical axis 76 of the optical cavity of the VCSEL.

Metal electrodes 78, 80 are applied to the top mirror stack and to the substrate, respectively, for electrically pumping the VCSEL. The current flows (as shown by arrow 82) around implanted current confining region 74 through a non-implanted central region, into the unetched island circumscribed by annular notch 70.

The inner boundary of annular current confining region 74 can extend laterally inside the inner boundary of annular notch 70 to overlap the unetched island according to a first option; or, the inner boundary of annular current confining region 74 can extend laterally to the region between the inner boundary of annular notch 70 and the outer boundary of annular notch 70 according to a second option (illustrated in FIG. 6). The two options lead to different device properties.

With the first option employed, the fundamental transverse mode will be preferentially pumped, leading to enhanced single-mode operation, but there will possibly be higher intracavity loss, and lower efficiency.

With the second option employed, intracavity loss will be decreased and efficiency increased, but the device will not exhibit single transverse mode operation unless some other feature such as tapered etching of annulus 70, as described with reference to FIGS. 4 and 5, is utilized.

Under the first option, annular current confining region 74 alone controls current flow into the active region of the device; under the second option (illustrated in FIG. 6), the current flow is constricted by a combination of ion implanted annulus 74 and etched annulus 70. In both the first option and the second option, current flows into the unetched island circumscribed by etched annulus 70 during operation.

Additionally, if annular notch 70 extends laterally underneath and well inward of the edge of metal electrode 78, the buried air gap will provide electrical current confinement as well as refractive index guiding. This configuration would eliminate the need for the ion-implanted annular current confining region 74, simplifying fabrication; however, this may reduce the mechanical robustness of the structure, because less of the surface at the interface between the upper cladding and the top mirror stack would be wafer fused.

Patterned wafer fusion provides refractive index guiding which promotes low-loss single or multi-mode operation in a VCSEL constructed according to the principles of the invention. The etched patterns further provide stress relief and an escape route for liquid and gas during wafer fusion.

While several particular forms of the invention have been illustrated and described, it will also be apparent that various modifications can be made without departing from the spirit and scope of the invention.

What is claimed is:

1. A process for use in fabricating laterally refractive index guided wafer-fused vertical cavity surface emitting lasers (VCSELs), the fabricated VCSEL comprising a plurality of layers of semiconductor, including a pair of mirror stacks and an active region interposed between the mirror stacks, the process comprising the following steps:

(A) first, etching a recessed pattern in one of the plurality of layers in a wafer to create a mode confining layer, which presents islands of unetched semiconductor in which optical energy is confined; and (B) next, wafer fusing the mode confining layer to an adjacent layer of the wafer so that a buried low refractive index material circumscribes each of the islands of unetched semiconductor and forms a lateral refractive index guide at the wafer fused interface between the mode confining layer and the adjacent layer.

2. The process of claim 1, wherein:

the active region includes InP and a material selected from the group consisting of InGaAsP, AlInGaAs, and combinations thereof;

at least one mirror stack includes alternating layers of GaAs and AlGaAs and is wafer fused to the active region; and the emission wavelength is in a range from 1250 nm to 1650 nm.

3. The process of claim 1, wherein:

the recessed pattern having an etch depth that is less than one-quarter the emission wavelength in the layer of semiconductor being etched.

4. The process of claim 1, wherein:

the majority of the mode confining layer is unetched to promote mechanical robustness.

5. The process of claim 1, wherein:

the recessed pattern presents a grid of annular notches defining the islands of unetched semiconductor in which optical energy is confined, and one or more connecting channels, the notches and channels providing a continuous etched path from any etched portion of the mode confining layer to the edge of the mode confining layer.

6. The process of claim 1, wherein:

the mirror stacks and the active region define an optical cavity having a central vertical axis, and further comprising the step:

disposing an annular current confinement aperture in one of the mirror stacks centered about the central vertical axis.

7. A VCSEL made by the process of claim 1.

* * * * *